(12) United States Patent
Yagoda et al.

(10) Patent No.: US 10,245,682 B2
(45) Date of Patent: Apr. 2, 2019

(54) LASER ABLATION FOR WIREBONDING SURFACE ON AS-CAST SURFACE

(71) Applicant: Continental Automotive Systems, Inc., Auburn Hills, MI (US)

(72) Inventors: Jared Yagoda, Wauconda, IL (US); Dana Gradler, Hoffman Estates, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 224 days.

(21) Appl. No.: 14/938,234

(22) Filed: Nov. 11, 2015

(65) Prior Publication Data

US 2017/0135195 A1    May 11, 2017

(51) Int. Cl.
*H05K 3/26* (2006.01)
*B23K 20/00* (2006.01)
*B23K 26/352* (2014.01)

(52) U.S. Cl.
CPC ........ *B23K 26/3576* (2018.08); *B23K 20/004* (2013.01); *H01L 2224/48472* (2013.01); *H01L 2224/85* (2013.01); *H05K 3/26* (2013.01); *H05K 2203/049* (2013.01); *H05K 2203/107* (2013.01)

(58) Field of Classification Search
CPC .............. B23K 26/362; B23K 2201/36; B23K 2201/42; B23K 26/00; B23K 26/0066; B23K 26/0054; B23K 26/3576; H01L 2924/12042; H01L 21/02098; H01L 2224/8501; H01L 2224/85016; H01L 2224/85039; H01L 2224/85019; H01L 2224/85017; H05K 3/26
See application file for complete search history.

(56) References Cited

U.S. PATENT DOCUMENTS

| 7,745,340 | B2 | 6/2010 | Ghosh et al. |
| 2004/0021176 | A1 | 2/2004 | Totori |
| 2004/0211761 | A1 | 10/2004 | Rumer et al. |
| 2009/0029542 | A1 | 1/2009 | Subido et al. |
| 2012/0206891 | A1* | 8/2012 | Yoshioka ............ H01L 21/4846 361/783 |

* cited by examiner

*Primary Examiner* — Catherine A. Simone (57) ABSTRACT

A method of removing material from a surface, which includes the steps of providing a base layer, at least one layer attached to the base layer, an intermediate finish surface, and a bonding interface surface. The intermediate finish surface is formed by removing the at least one layer and a portion of the base layer during a material removal process. The bonding interface surface is formed by a polishing process applied to the intermediate finish surface. There is an oxidation layer which is part of the base layer, as well as a mold release layer and a contamination layer, both of which are part of the at least one layer. The material removal process involves laser etching the at least one layer to create the intermediate finish surface, and the polishing process includes applying a second laser etching to the intermediate finish surface, forming the bonding interface surface.

7 Claims, 9 Drawing Sheets

FIG. 10B

LASER ABLATION FOR WIREBONDING SURFACE ON AS-CAST SURFACE

FIELD OF THE INVENTION

The invention relates generally to a surface treatment for a casting surface, to make the casting surface more suitable for wire bonding and other processes.

BACKGROUND OF THE INVENTION

Circuit assemblies have different components that are assembled using different manufacturing processes. One of the components often used in a circuit assembly is a metal casting, which is typically in the form of a heat sink. The heat sink is connected to other components, such as a printed circuit board (PCB). The connection between the heat sink and the PCB is typically accomplished using a wire bonding process, where the surface requirements are always high in regard to cleanliness, composition, roughness, and finish.

Wire bonding is the method by which a length of small diameter soft metal wire is attached to a compatible metallic surface without the use of solder, flux, and in some cases, with use of heat above 150 degrees Celsius. Soft metals includes Gold (Au), Copper (Cu), Silver (Ag), Aluminum (Al), and alloys such as Palladium-Silver (PdAg) and others.

Some current processes used for wire bonding on the PCB require a specific intermetallic interface between the aluminum bond and nickel phosphorus plating for solder and bonding. These processes also have various failure modes which limit the applications which the wire bonding process may be used for.

Immersion gold is a robust surface for bonding. However, contamination or imperfections in the gold may result in a non-stick condition. The failures may be the result of supplier manufacturing, shipment, or production environment, or other factors.

One type of process for polishing the surface is a diamond milling process. However, this process is expensive, and increases manufacturing costs significantly when used.

Accordingly, there exists a need for a process which provides a surface that is sufficient for wire bonding, minimizes or eliminates failures, and is cost effective.

SUMMARY OF THE INVENTION

The present invention is a surface treatment process used to improve wire bonding between a PCB and a heat sink in a transmission control module, where the surface of the heatsink has been etched using a laser, thereby cleaning the surface before bonding. In one embodiment, the laser has a 1064 nm wavelength, but it is within the scope of the invention that other wavelengths may be used. This process minimizes the various failure modes that may occur at the bonding interface.

In another embodiment, the process of the present invention may be used for as-cast base plates. As mentioned above, any contamination or surface faults between an aluminum bond and an aluminum base plate reduces the robustness of the connection. By using the laser process of the present invention, a bond is made with high strength, removing the need for post processing the casting progression, such as diamond milling or surface treatments. The laser process of the present invention involves two steps, the first step is a laser etch ablation process where material is removed, and the second step is a second laser etch to clean and smooth the surface.

In one embodiment, the present invention involves bonding to a nickel phosphorous (NiP) and Au surface that has been exposed to a laser etch. In another embodiment, there is bonding to an as-cast surface (which has no post-casting surface treatment or finish) using laser ablation. The process of the present invention also involves no-clean flux from Au plated PCB bond pads.

It is an object of this invention to provide a consistent surface finish due to the placement process, which allows for a very robust wire bonding connection.

It is another object of this invention to remove contamination to provide a more robust surface for wire bonding post-cleaning.

It is also an object of this invention to eliminate the need for post-casting surface treatment, providing a cost savings.

In one embodiment, the present invention is a casting assembly having a bonding interface surface. In one embodiment, the casting assembly includes a base layer and an oxidation layer formed during the casting process. In other embodiments, the casting assembly may include a mold release layer. A contamination layer may form if the outer surface of the casting assembly is exposed to various debris and contaminants after being removed from the mold. There is also an intermediate finish surface, and a bonding interface surface. A material removal process is applied to the outer surface of the casting assembly to remove the contamination layer, the mold release layer, the oxidation layer, and a portion of the base layer to form the intermediate finish surface. Once the intermediate finish surface is formed, a material polish process is applied to the intermediate surface finish to form the bonding interface.

In one embodiment, the mold release layer is a mold release material for facilitating the removal of the casting assembly from a mold.

The base layer may be made from one of several materials, such as, but not limited to, aluminum, silver, gold, and copper.

In an embodiment, the present invention is a method of removing material from a surface, which includes the steps of providing a base layer, providing at least one layer attached to the base layer, providing an intermediate finish surface, and providing a bonding interface surface. The intermediate finish surface is formed by removing the at least one layer and a portion of the base layer during a material removal process. The bonding interface surface is formed by a polishing process applied to the intermediate finish surface.

In one embodiment, there is a base layer and an oxidation layer formed during the casting process. In other embodiments, the at least one layer may include a mold release layer. A contamination layer may form if the outer surface of the casting assembly is exposed to various debris and contaminants after being removed from the mold.

The oxidation layer, mold release layer, and the contamination layer are removed during the material removal process. The material removal process involves laser etching the at least one layer to create the intermediate finish surface, but is it within the scope of the invention that other types of processes may be used.

The polishing process includes the steps of applying a second laser etching to the intermediate finish surface, to form the bonding interface surface. The first laser etching process is different from the second laser etching process to form the bonding interface surface.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
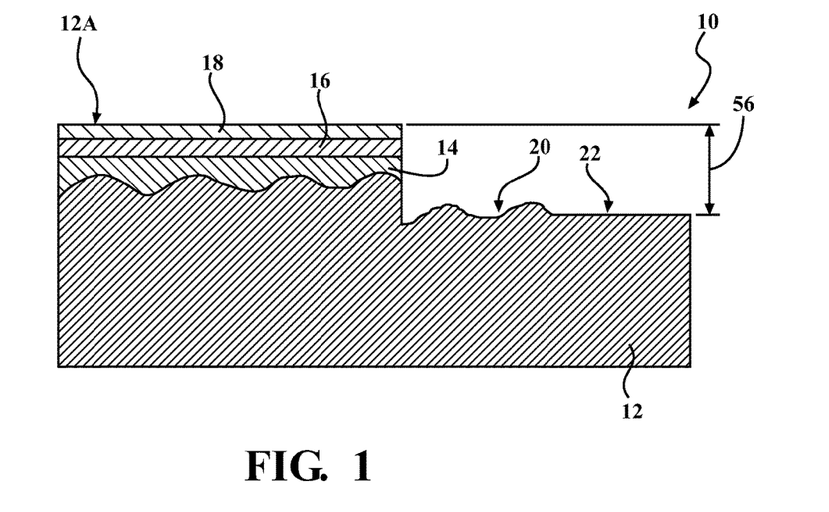
FIG. 1 is a sectional view of a portion of a metal casting having undergone a surface finish process, according to embodiments of the present invention.

A sectional view of a portion of a metal casting assembly is shown in FIG. 1 generally at 10. The assembly 10 includes a base layer 12 having an outer surface, shown generally at 12A. When the casting assembly 10 is formed, the process typically involves a mold, where the material used to form the casting assembly 10 is injected into the mold. When the casting assembly 10 is removed from the mold, there is typically an oxidation layer 14 formed on the base layer 12, a mold release layer 16 attached to the oxidation layer 14, and some form of contamination material, which forms a contamination layer 18 on the mold release layer 16.

The oxidation layer 14 forms as part of the base layer 12 due to heat exposure during the casting process. The mold release layer 16 is made from a mold release material which is used to facilitate the removal of the casting assembly 10 from the mold. The contamination layer 18 is made of debris and other substances that may be located inside the mold during the casting process, or substances that could be anything contacting the casting assembly 10 after the molding process. Any one or a combination of the oxidation layer 14, the mold release layer 16, or the contamination layer 18 may be exposed on the outer surface 12A, depending upon how the casting assembly 10 is made, and the environment the assembly 10 is exposed to after the casting process. In one embodiment, the oxidation layer 14 is formed such that the oxidation layer 14 is part of the outer surface 12A, and the mold release layer 16 and contamination layer 18 are disposed on the surface 12A, on top of the oxidation layer 14.

The first step of the process according to the present invention is a material removal process, where a laser etch is applied to the outer surface 12A of the casting assembly 10 such that the contamination layer 18, the mold release layer 16, the oxidation layer 18, and a portion of the base layer 12 are all removed, leaving a rough finish on the outside surface 12A of the base layer 12. This rough finish is an intermediate finish surface, shown generally at 20. This material removal process functions to ablate and remove material. The laser may be any type of laser suitable for removing material from the casting assembly 10. In one embodiment, during the material removal process, the laser has operating parameters of 38-42 Amps, 3000-10,000 Hertz, a speed range of 50-200 mm/sec, and passes over the surface 10-100 times to create the intermediate finish surface 20. In yet another embodiment, during the material removal process, the laser has operating parameters of 40 Amps, 3600 Hertz, a speed of 120 mm/sec, and passes over the surface 54 times to create the intermediate finish surface 20. The laser used during the material removal process has a wavelength of 1064 nm, but it is within the scope of the invention that other wavelengths may be used.

The second step in the process according to the present invention is a polishing process. The polishing process is applied to the intermediate finish surface 20, transforming the intermediate finish surface 20 into a bonding interface surface, shown generally at 22. The polishing process may also be applied using a laser, and in one embodiment, during the polishing process, the laser may have operating parameters of 30-38 Amps, 20,000-40,000 Hertz, a speed of 100-400 mm/sec, and passes over the surface 5-20 times to create the bonding interface surface 22. In another embodiment, during the polishing process, the laser is operated at 36 Amps, 36,000 Hertz at a speed of 300 mm/sec, and passes over the surface 7 times to create the bonding interface surface 22.

Once the bonding interface surface 22 is formed, the bonding interface surface 22 may be used for a wire bonding process, bonding the base layer 12 to a PCB board. In one embodiment, the bonding interface surface 22 has surface characteristics that are a result from undergoing both the material removal process and the polishing process. There is a total amount of material removed from the assembly 10 after undergoing both the material removal process and the polishing process, which places the bonding interface surface 22 at a "depth" relative to the original outer surface 12A. In one embodiment, the depth 56 of the bonding interface surface 22 is about 3.7-37.0 microns, and the bonding interface surface 22 has a roughness Rz of less than 10 microns, but it is within the scope of the invention that other targets for the depth 56 and roughness may be used, depending on the materials used for the casing assembly 10.

Referring to FIGS. 4-10B, various photos and graphs are shown depicting an example of a portion of a casting assembly 10, with a portion of the outer surface 12A having the bonding interface surface 22 placed under a digital microscope. There are areas of the outer surface 12A that have not undergone the material removal process, shown generally at 12B, along with the bonding interface surface 22 shown in FIGS. 4-10B.

Figure 6A:
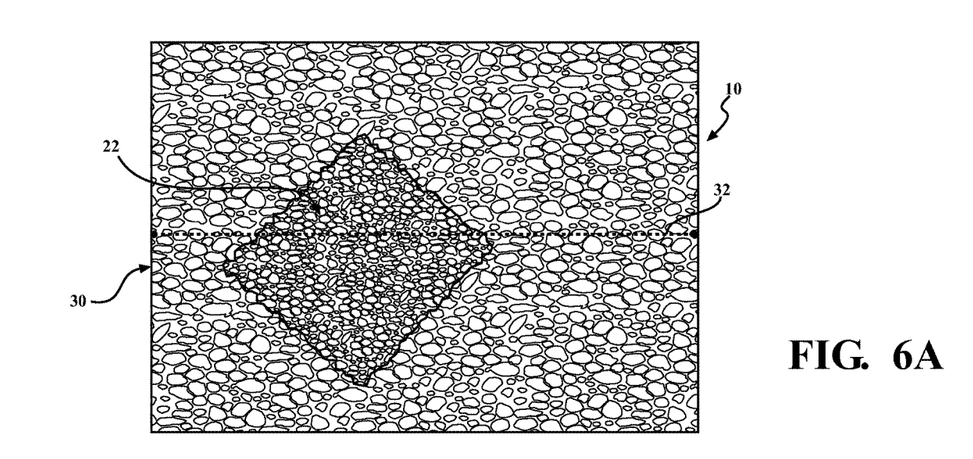
FIG. 6A is a greatly enlarged view of first area of a metal casting having undergone a surface finish process, that includes a measurement line extending through both a bonding interface surface and a non-lasered area, according to embodiments of the present invention.
Figure 6B:
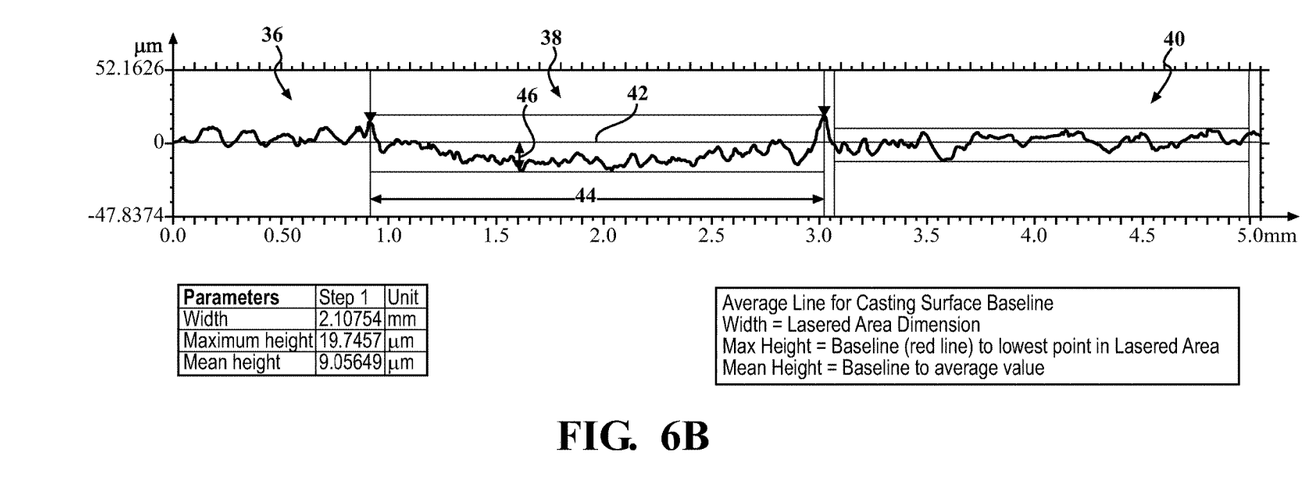
FIG. 6B is a first graph representing depth measurements of the measurement line in FIG. 6A.

Referring to FIG. 6A, there is a photo 30 of an area of a casting assembly 10 which has the bonding interface surface 22. The photo 30 includes a measurement line 32, which is the distance measured taken along the surface 12A of the casting assembly 10 and bonding interface surface 22 shown in FIG. 6A. In FIG. 6B, there is a first graph 34 depicting a surface measurement of the casting assembly 10, including the bonding interface surface 22 (i.e., lasered area), and the areas of the casting assembly 10 that have not been exposed to either the material removal process, or the polishing process (i.e., non-lasered area). In FIGS. 6A and 6B, the measurement line 32 is about 5.0 mm, as can be seen by the lower scale in FIG. 6B, but it is within the scope of the invention that other lengths may be used.

The first graph 34 from FIG. 6B has three sections, a first section, shown generally at 36, a second section, shown generally at 38, and a third section, shown generally at 40. The first and third sections 36,40 represent areas of the outer surface 12A in FIG. 6A that have not been exposed to either the material removal process, or the polishing process, and the second section 38 represents the area of the outer surface 12A in FIG. 6A that has undergone both the material removal process and the polishing process. Also included in FIG. 6B is a first reference line 42, the first reference line 42 is the average height of the non-lasered areas (sections 36,40) taken along the measurement line 32 in FIG. 6A.

The second section 38 has a width 44 of just over 2.0 mm, but it is within the scope of the invention that the width 44 may vary, depending upon the location of the measurement line 32 and the size of the bonding interface surface 22. As is shown in FIG. 6B, there is a maximum height 46, which is the distance from the reference line 42 to the lowest point in the second section 38. The second section 38 also has a mean height, which is the difference in the average height of the lasered surface (section 38) and the average height of the non-lasered surface (sections 36,40), which is shown in FIG. 6B as about 9.06 μm.

Figure 7A:
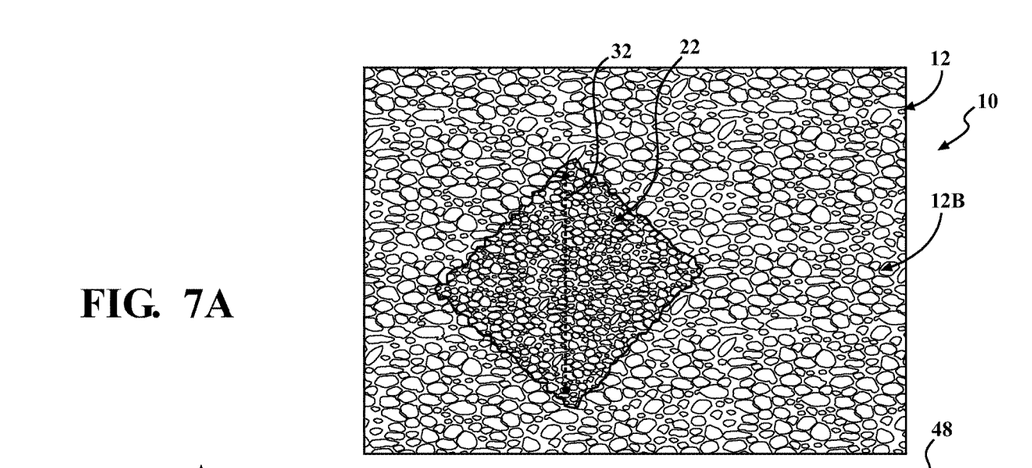
FIG. 7A is a greatly enlarged view of first area of a metal casting having undergone a surface finish process, that includes a measurement line extending through part of a bonding interface surface in a first direction, according to embodiments of the present invention.
Figure 7B:
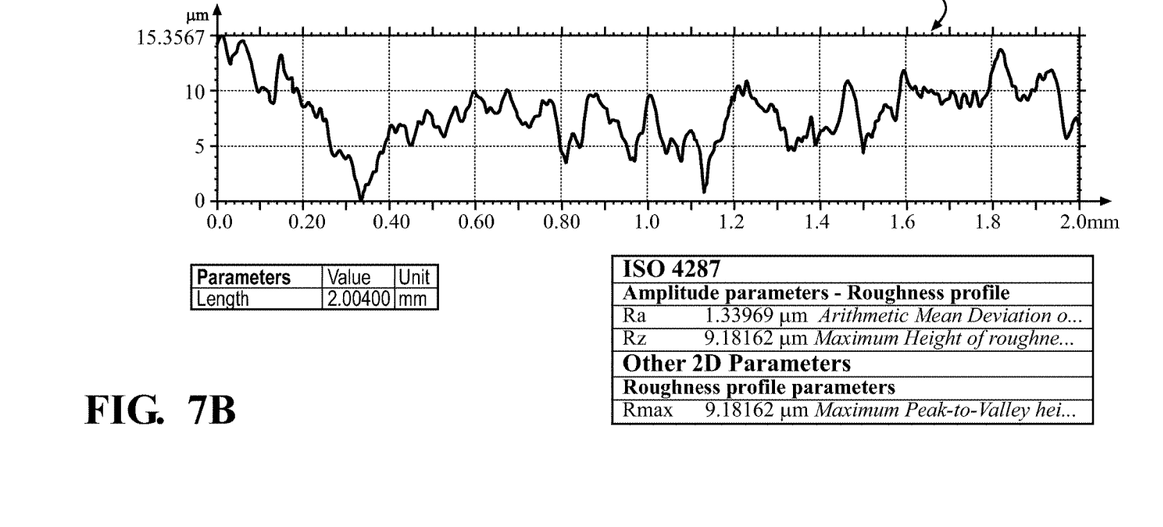
FIG. 7B is a graph representing roughness measurements of the measurement line in FIG. 7A.

Referring now to FIG. 7A, there is the same photo 30 shown in FIG. 6A, however, the measurement line 32 is at a different location and direction, and therefore represents a different surface measurement of the bonding interface surface 22. The measurement line 32 in FIG. 7A is about 2.0 mm, and there is a second graph 48 in FIG. 7B showing the surface measurement of the measurement line 32 in FIG. 7A. In FIGS. 7A and 7B, the surface measurement taken along the measurement line 32 has a roughness measurement Rz of about 9.18 μm.

Figure 8A:
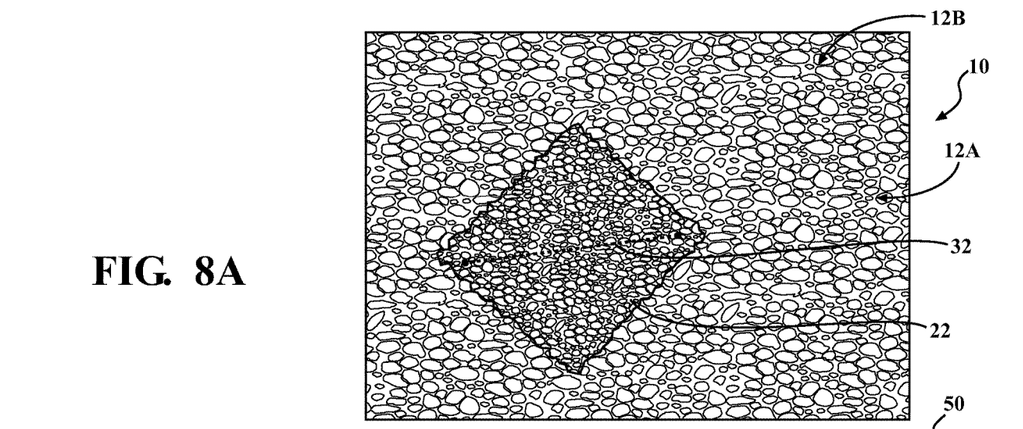
FIG. 8A is a greatly enlarged view of first area of a metal casting having undergone a surface finish process, that includes a measurement line extending through part of a bonding interface surface in a second direction, according to embodiments of the present invention.
Figure 8B:
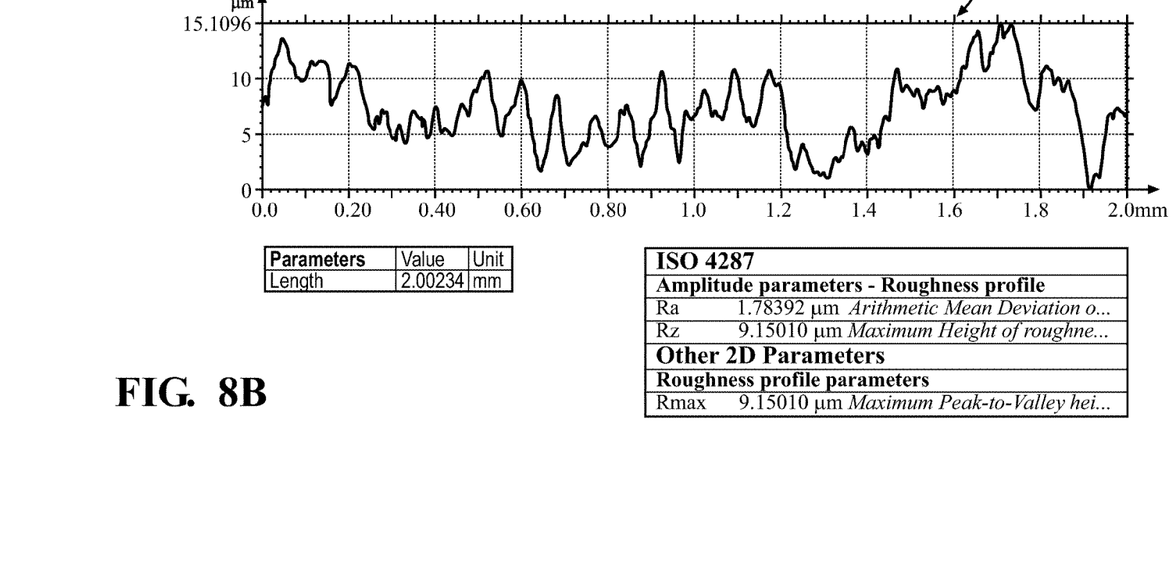
FIG. 8B is a graph representing roughness measurements of the measurement line in FIG. 8A.

Referring to FIG. 8A, there is again the same photo 30 shown in FIG. 6A, with the measurement line 32 at yet another location and direction, therefore representing a different surface measurement of the bonding interface surface 22. Again, the measurement line in FIG. 8A is about 2.0 mm, and there is a third graph 50 in FIG. 8B showing the surface measurement line 32 in FIG. 8A. In FIGS. 8A and 8B, the surface measurement taken along the surface measurement line 32 has a roughness measurement Rz of about 9.15 μm. The measurements taken along the measurement lines 32 in both FIG. 7A and FIG. 8A produce similar measured results.

Referring now to FIG. 9A, again the same photo 30 is shown that is shown in FIGS. 6A, 7A, and 8A. However, in FIG. 9A, the measurement line 32 is taken at a location on the outer surface 12A that is outside of the bonding interface surface 22. Once again, the measurement line 32 is about 2.0 mm, and there is a fourth graph 52 in FIG. 9B showing the surface measurement represented by the measurement line 32 in FIG. 9A. It can be seen in FIGS. 9A and 9B that the surface measurement taken along the surface measurement line 32 has a roughness measurement Rz of about 16.35 μm.

Referring to FIGS. 10A and 10B, again the same photo 30 is shown that is shown in FIGS. 6A, 7A, 8A, and 9A. However, in FIG. 10A, the measurement line 32 is again located outside the bonding interface surface 22, but in a different location and direction compared to the measurement line 32 in FIG. 9A. Once again, the measurement line 32 is about 2.0 mm, and there is a fifth graph 54 in FIG. 10B showing the surface measurement represented by the measurement line 32 in FIG. 10A. It can be seen in FIGS. 10A and 10B that the surface measurement taken along the surface measurement line 32 has a roughness measurement Rz of about 14.73 μm.

Figure 9A:
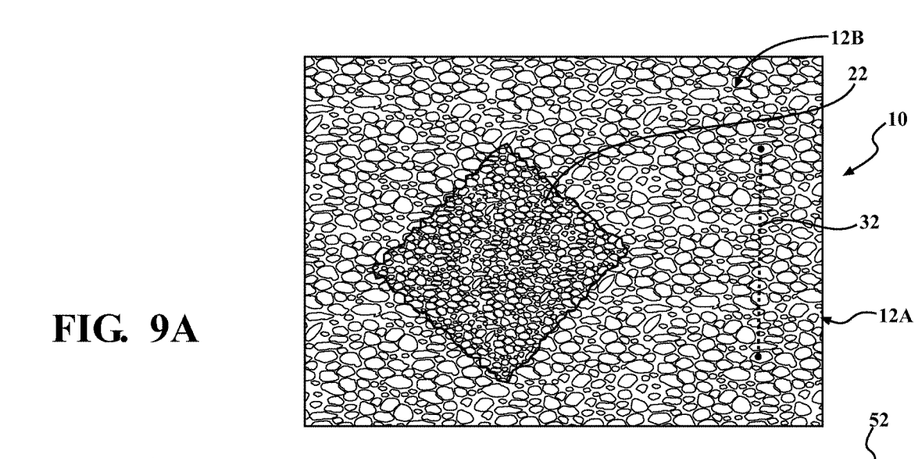
FIG. 9A is a greatly enlarged view of first area of a metal casting having undergone a surface finish process, that includes a measurement line extending through part of an outer surface of a casting assembly in a first direction, outside of a bonding interface surface, according to embodiments of the present invention.
Figure 9B:
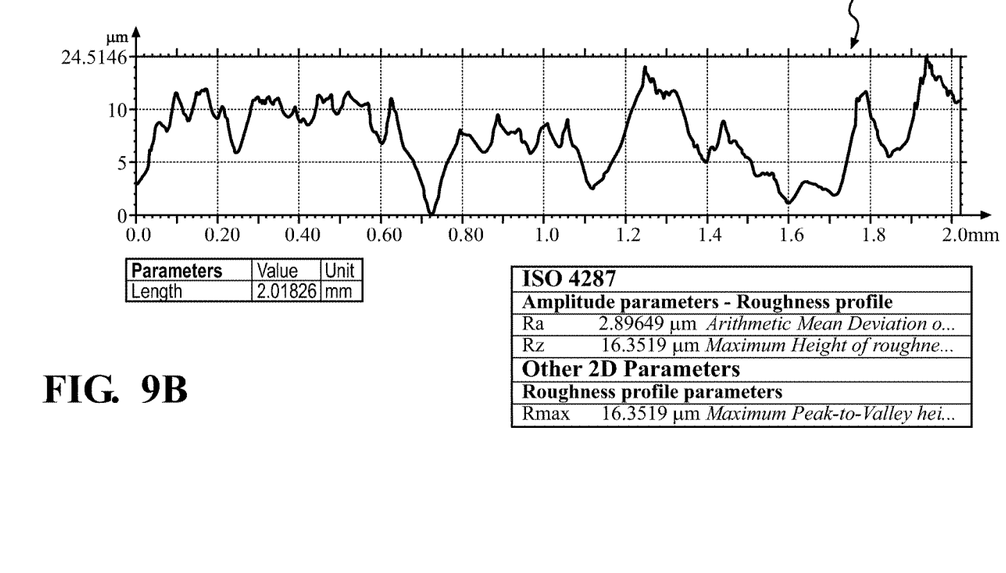
FIG. 9B is a graph representing roughness measurements of the measurement line in FIG. 9A.
Figure 10A:
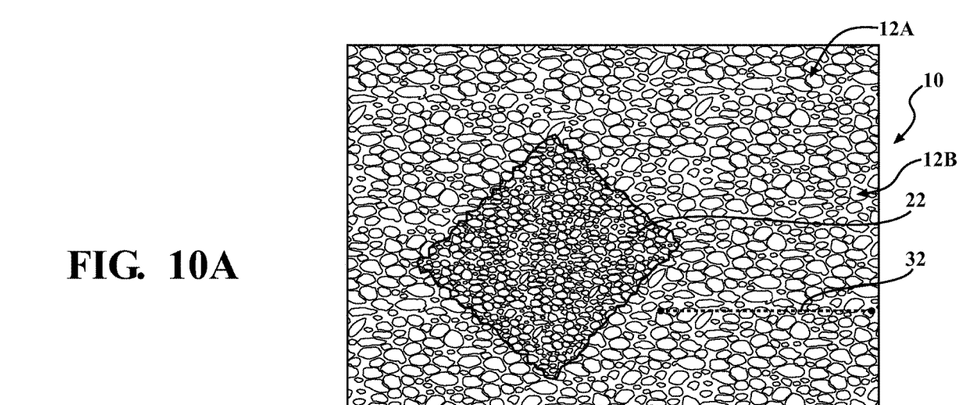
FIG. 10A is a greatly enlarged view of first area of a metal casting having undergone a surface finish process, that includes a measurement line extending through part of an outer surface of a casting assembly in a second direction, outside of a bonding interface surface, according to embodiments of the present invention.
Figure 10B:
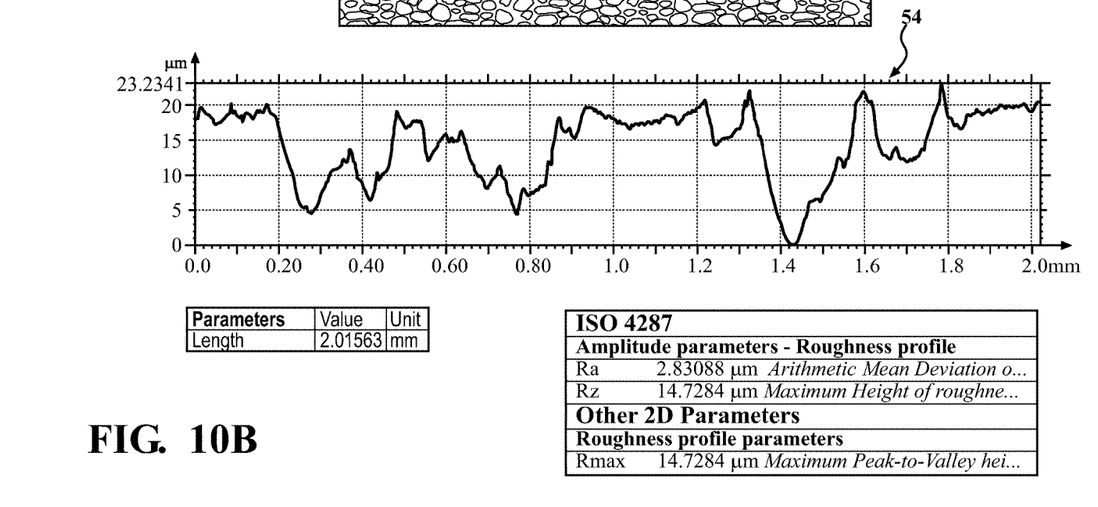
FIG. 10B is a graph representing roughness measurements of the measurement line in FIG. 10A.

Furthermore, the roughness measurements (Rz) are about 9.18 μm and 9.15 μm in FIGS. 7A and 8A, respectively, and the roughness measurements are about 16.35 μm and 14.73 μm in FIGS. 9A and 10A, which is significantly larger than the roughness measurements in FIGS. 7A and 8A.

Figure 2:
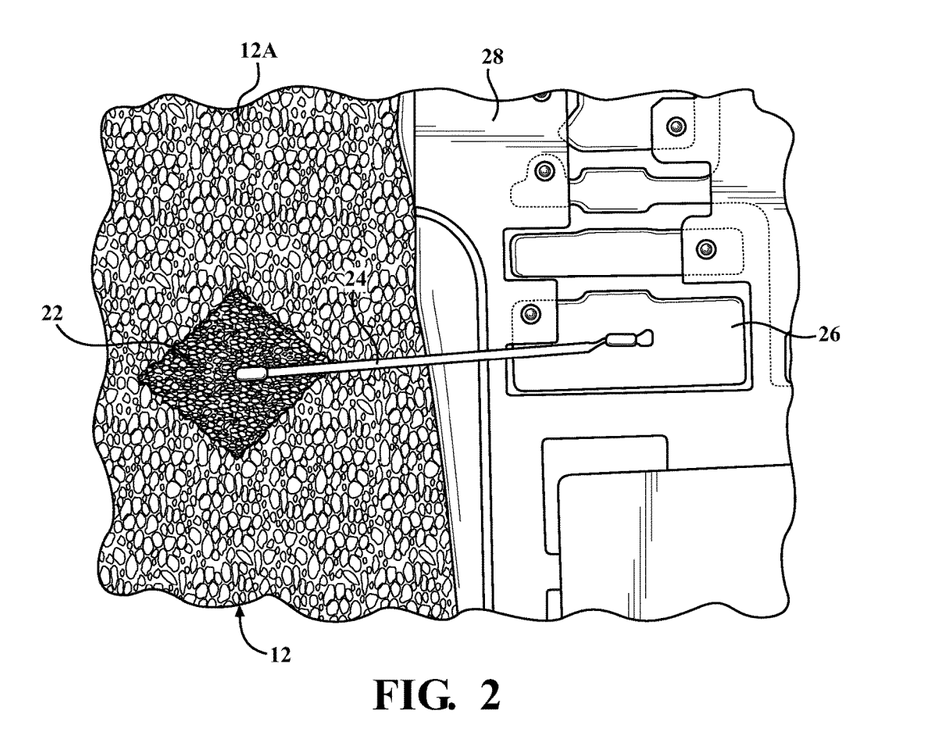
FIG. 2 is a perspective view of a first area of a metal casting having undergone a surface finish process, according to embodiments of the present invention.
Figure 3:
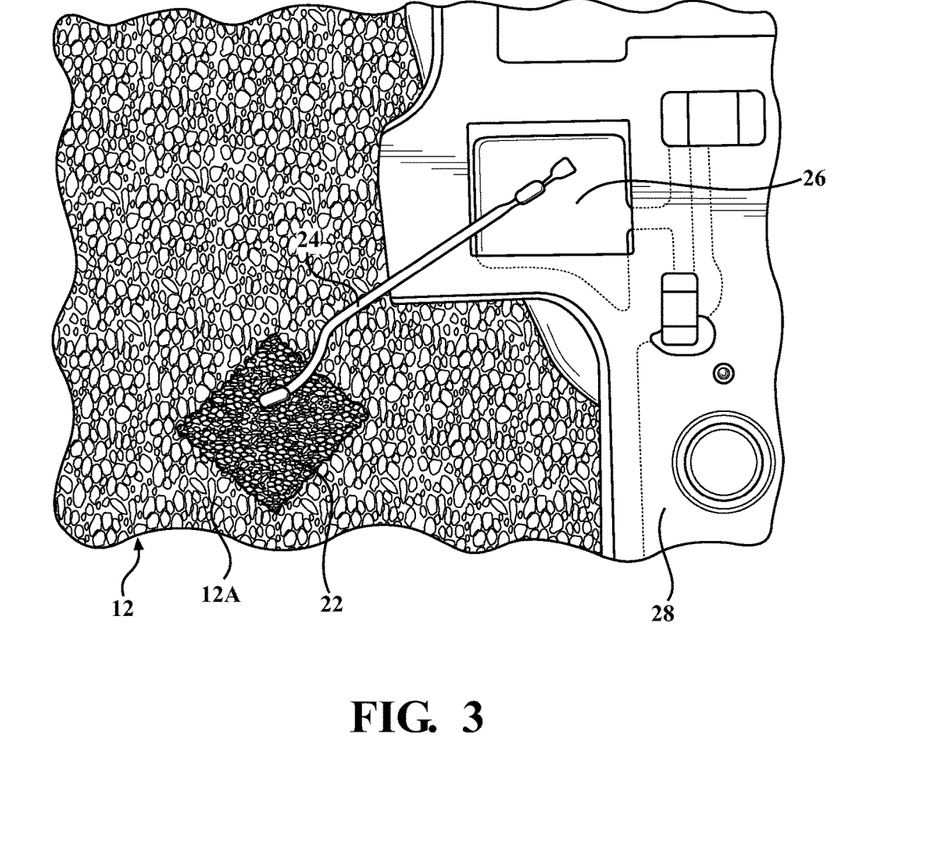
FIG. 3 is a perspective view of a second area of a metal casting having undergone a surface finish process, according to embodiments of the present invention.
Figure 4:
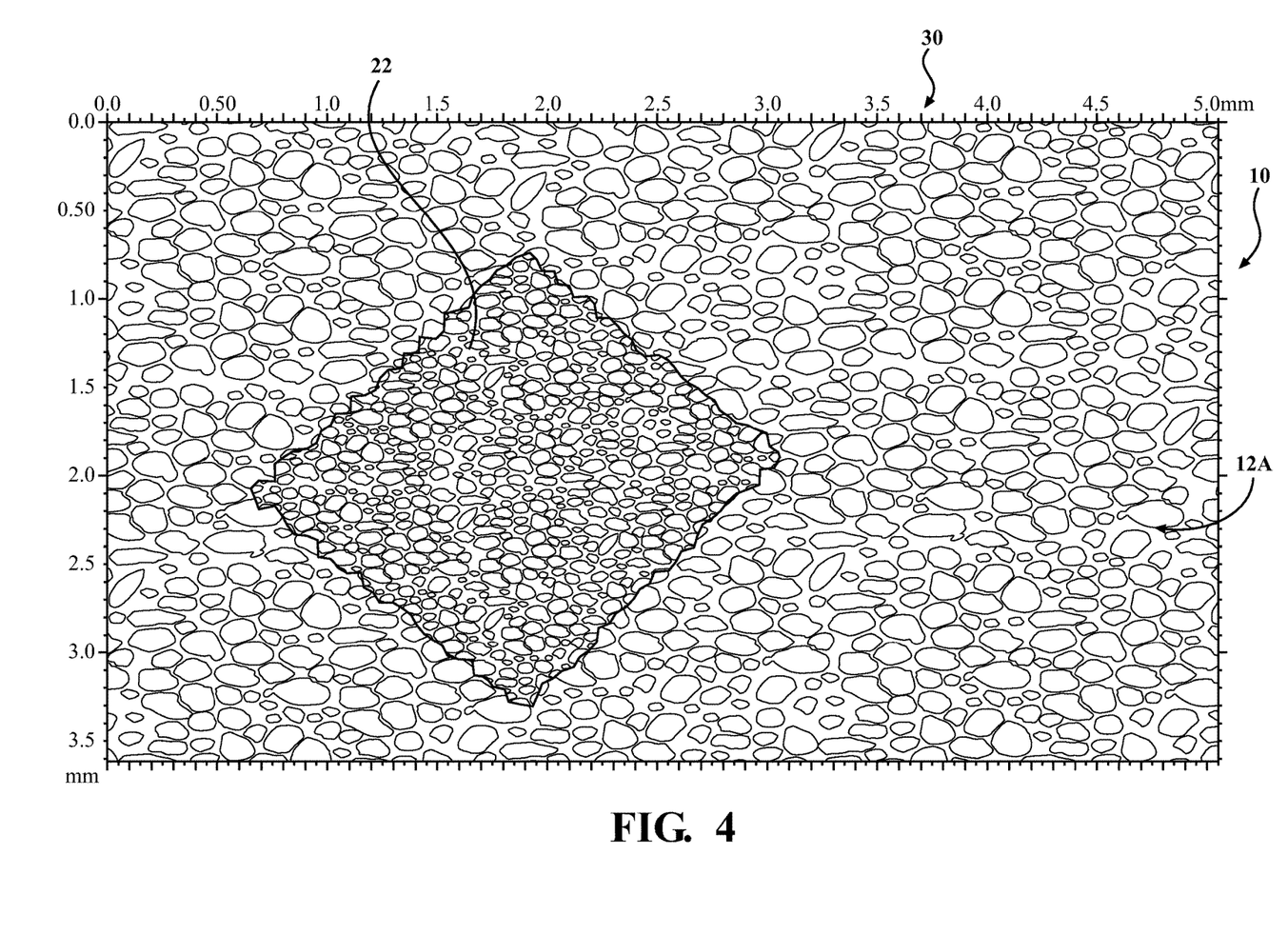
FIG. 4 is an enlarged view of a first area of a metal casting having undergone a surface finish process, according to embodiments of the present invention.
Figure 5:
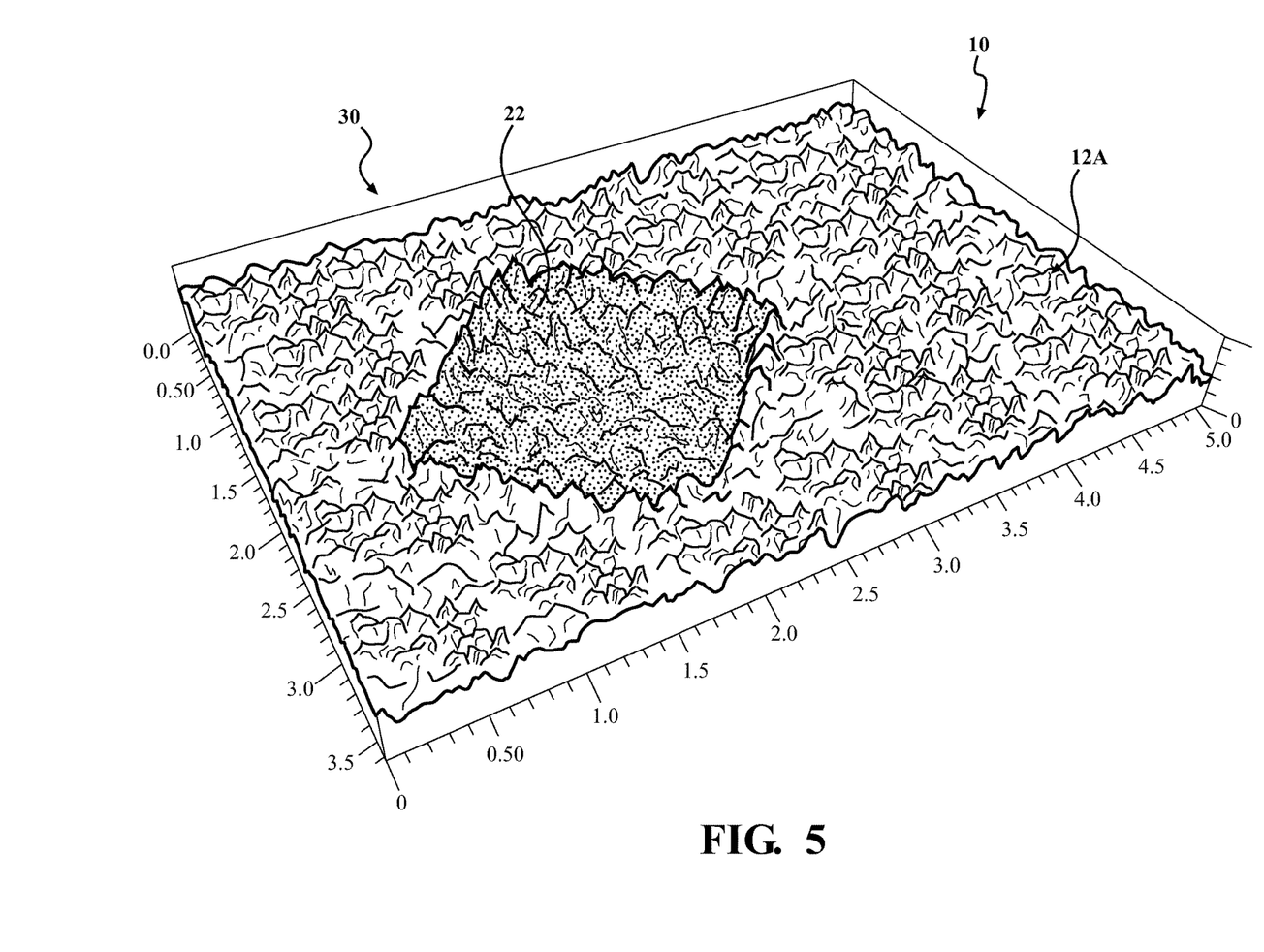
FIG. 5 is a greatly enlarged topographical view of a first area of a metal casting having undergone a surface finish process, according to embodiments of the present invention.

Examples of the completed wire bond are shown in FIGS. 2 and 3. The base layer 12 is shown having the outer surface 12A exposed, and the bonding interface surface 22, which is formed with both the material removal process and the polishing process. A wire 24 is shown bonded to a bond pad 26 of a PCB board 28, and the wire 24 is also bonded to the bonding interface surface 22 formed as part of the base layer 12.

In one embodiment, the wire used for the wire bonding process is 203.2 μm in diameter, but it is within the scope of the invention that wires of other diameters may be used, such as, but not limited to, 125.0 μm to 508.0 μm, depending upon the type of material used for the process. In this embodiment, the material used for the wire bonding is aluminum, but it is within the scope of the invention that other materials may be used, such as, but not limited to, gold, silver, copper, and nickel. The target roughness value Rz for the bonding interface surface 22 is less than 10 μm, regardless of material or depth 56. When aluminum is used, the bonding interface surface 22 has a target depth 56 of 3.7 to 37.0 μm.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A casting assembly comprising:
   a base layer;
   an oxidation layer disposed on the base layer;
   a mold release layer disposed on the oxidation layer;
   a contamination layer disposed on the mold release layer;
   a base layer outer surface being a surface of the contamination layer; and
   a bonding interface surface defined by the base layer outer surface, the bonding interface surface formed by:
      a material removal process including a first laser etching process applied to a section of the base layer outer surface to remove the contamination layer, the mold release layer, the oxidation layer, and a portion of the base layer to form an intermediate finish surface; and
      a material polish process including a second laser etching process applied to the base layer to form the bonding interface surface.

2. The casting assembly of claim 1, wherein the mold release layer further comprising a mold release material for facilitating the removal of the casting assembly from a mold.

3. The casting assembly of claim 1, wherein the base layer further comprises a material selected from the group consisting of aluminum, silver, gold, and copper.

4. The casting assembly having of claim 1, wherein the contamination layer is part of the base layer.

5. The casting assembly of claim 1, wherein the first laser etching process is different from the second laser etching process.

6. The casting assembly of claim 1, wherein a roughness of the bonding interface surface is less than 10 μm.

7. The casting assembly of claim 1, wherein a depth of the bonding interface surface with respect to the base layer outer surface is less than 37.0 μm.

* * * * *